US008030737B2

(12) United States Patent
Oshida et al.

(10) Patent No.: US 8,030,737 B2
(45) Date of Patent: Oct. 4, 2011

(54) SEMICONDUCTOR DEVICE AND METHOD OF MANUFACTURING THE SAME

(75) Inventors: Daisuke Oshida, Kawasaki (JP); Toshiyuki Takewaki, Kawasaki (JP); Takuji Onuma, Kawasaki (JP); Koichi Ohto, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 754 days.

(21) Appl. No.: 11/971,925

(22) Filed: Jan. 10, 2008

(65) Prior Publication Data

US 2008/0217737 A1 Sep. 11, 2008

(30) Foreign Application Priority Data

Mar. 7, 2007 (JP) ................................ 2007-057469

(51) Int. Cl.
*H01L 21/02* (2006.01)
*H01L 29/92* (2006.01)
(52) U.S. Cl. ......... 257/532; 257/E21.008; 257/E29.342; 438/393; 438/937
(58) Field of Classification Search .................... 438/257
See application file for complete search history.

(56) References Cited

U.S. PATENT DOCUMENTS

| 3,620,833 | A | * | 11/1971 | Gleim et al. ................. 438/404 |
| 3,789,276 | A | * | 1/1974 | Sivertsen ....................... 257/506 |
| 4,885,262 | A | * | 12/1989 | Ting et al. ..................... 438/669 |
| 5,759,912 | A | * | 6/1998 | Mori et al. ..................... 438/624 |
| 6,010,963 | A | * | 1/2000 | Allman et al. ................. 438/690 |
| 6,228,667 | B1 | * | 5/2001 | Cathey et al. .................... 438/20 |
| 6,500,754 | B1 | * | 12/2002 | Erb et al. ....................... 438/626 |
| 6,764,951 | B1 | * | 7/2004 | van Ngo ....................... 438/687 |
| 6,806,184 | B2 | * | 10/2004 | Chen et al. ..................... 438/633 |
| 6,846,752 | B2 | * | 1/2005 | Chambers et al. ............. 438/771 |
| 7,067,437 | B2 | | 6/2006 | Edelstein et al. |
| 2003/0209738 | A1 | | 11/2003 | Ohto et al. |
| 2004/0198068 | A1 | | 10/2004 | Yoshie |
| 2004/0259378 | A1 | * | 12/2004 | Chambers et al. ............. 438/771 |
| 2005/0012096 | A1 | * | 1/2005 | Yamazaki et al. ............... 257/57 |
| 2007/0034924 | A1 | | 2/2007 | Takewaki et al. |

FOREIGN PATENT DOCUMENTS

| CN | 63-179943 | 7/1998 |
| CN | 1457095 | 11/2003 |
| CN | 1532896 | 9/2004 |
| CN | 1595634 | 3/2005 |
| CN | 1913158 | 2/2007 |
| EP | 681327 A2 * | 11/1995 |
| JP | 01-147844 | 6/1989 |
| JP | 08241892 A * | 9/1996 |
| JP | 2003-258107 | 9/2003 |

OTHER PUBLICATIONS

Chinese Patent Office issued a Chinese Office Action dated May 22, 2009, Application No. 2008100812634.

* cited by examiner

*Primary Examiner* — N Drew Richards
*Assistant Examiner* — Robert Carpenter
(74) *Attorney, Agent, or Firm* — Young & Thompson

(57) ABSTRACT

A semiconductor device including: a substrate; an insulating film formed over the substrate; a copper interconnect, having a plurality of hillocks formed over the surface thereof, buried in the insulating film; a first insulating interlayer formed over the insulating film and the copper interconnect; a second insulating interlayer formed over the first insulating interlayer; and an electroconductive layer formed over the second insulating interlayer, wherein the top surface of at least one hillock highest of all hillocks is brought into contact with the lower surface of the second insulating interlayer is provided.

13 Claims, 5 Drawing Sheets

SEMICONDUCTOR DEVICE AND METHOD OF MANUFACTURING THE SAME

This application is based on Japanese patent application No. 2007-057469 the content of which is incorporated hereinto by reference.

BACKGROUND

1. Technical Field

The present invention relates to a semiconductor device and a method of manufacturing the same.

2. Related Art

In recent years, there has been an increasing trend of using metal-insulator-metal type (MIM-type) capacitor element, having parasitic resistance and parasitic capacitance extremely smaller than those of conventional MOS-type capacitor element. One-chip configuration having such MIM-type capacitor element integrated into a logic device has also been developed. To realize this sort of configuration, structures and processes of manufacturing of both devices should be harmonized. The logic device generally adopts a multi-layer structure. A critical technical issue resides therein is how to harmonize the structure and processes of the MIM-type capacitor element to the multi-layer structure in an appropriate manner. From this point of view, there has been developed a process by which electrodes in the MIM-type capacitor element are fabricated by a technique similar to those for the multi-layer structure of the logic device.

As described in Japanese Laid-Open Patent Publication No. 2003-258107, the conventional MIM-type capacitor element often formed in a region having no lower interconnect formed therein, and rarely formed above the region having a high density of fine interconnects formed therein.

However, elements have more advanced in terms of degree of integration in these days, and the situation demands that the MIM-type capacitor element should be formed also above the region having a high density of fine interconnects formed therein, in order to reduce area of the semiconductor device. The requirement raises problems below.

The multi-layered interconnect of the logic devices in these days generally adopts copper interconnect having low resistivity. Damascene process is widely adopted to form the copper interconnect. In the damascene process, first, trenches are formed in an insulating film such as a silicon oxide film, and a barrier metal layer for blocking diffusion of copper is formed. The trenches are then filled with copper typically by plating, and the copper is then polished by chemical mechanical polishing (CMP) to thereby form the interconnect. On the copper interconnect, a diffusion barrier film such as a SiCN film is formed, wherein the interconnect produces hillocks on the surface thereof, due to annealing carried out as pretreatment of formation of the diffusion barrier film, and thereby sharp differences in height may be produced on the surface of the interconnect. The difference in height is reflected also to the diffusion barrier film formed thereon, and is reflected further to the insulating interlayer and the capacitor element formed further thereon. Such sharp differences in height remained unremoved on the capacitor element may cause short-circuiting between the lower interconnect and the capacitor element, due to contact between the top surfaces of the hillocks on the lower interconnect and the lower electrode of the capacitor element, or may degrade margin for short-circuiting due to close disposition of the top surfaces of the hillocks and the lower electrode, even though this would not result in actual short-circuiting. This may be causative of degradation in yield ratio of the MIM-type capacitor elements, and degradation in reliability of use.

This nonconformity may occur, not only for the case where the MIM-type capacitor element is used in the upper region, but also for the case of general multi-layered interconnect having the damascene structure. In other words, the difference in height, ascribable to the hillocks on the lower interconnect in the process of forming the multi-layered interconnect, is reflected also to the upper interconnect. As a consequence, short-circuiting between the upper and lower interconnects due to contact between the hillocks of the lower interconnect and the upper interconnect, and degradation in the margin for short-circuiting would occur.

SUMMARY

According to the present invention, there is provided a semiconductor device including:

a substrate;

an insulating film formed over the substrate;

a copper interconnect, having a plurality of hillocks formed over the surface thereof, buried in the insulating film;

a first insulating interlayer formed over the insulating film and the copper interconnect;

a second insulating interlayer formed over the first insulating interlayer; and an electroconductive layer formed over the second insulating interlayer, wherein the top surface of at least one hillock highest of all hillocks is brought into contact with the lower surface of the second insulating interlayer.

According to the present invention, there is provided also a method of manufacturing a semiconductor device including:

forming a copper interconnect by filling a recess provided to an insulating film formed over a substrate with a copper-containing electroconductive material, and by removing a portion of the electroconductive material exposed out from the recess by chemical mechanical polishing;

annealing the entire portion of the substrate;

forming a first insulating interlayer over the insulating film and the copper interconnect;

planarizing the surface of the first insulating interlayer;

forming a second insulating interlayer over the first insulating interlayer; and forming an electroconductive layer over the second insulating interlayer, wherein, in the annealing, a plurality of hillocks are formed on the surface of the copper interconnect, and in the planarizing the surface of the first insulating interlayer, the first insulating interlayer being planarized until at least one hillock is exposed to the surface of the first insulating interlayer.

According to these configurations, the top surface of at least one hillock highest of all hillocks and the top surface of the first insulating interlayer may be aligned approximately in the same plane. By virtue of this configuration, even if the hillocks should be formed over the surface of the copper interconnect, the first insulating interlayer formed over the copper interconnect may be planarized on the top surface thereof, and thereby also the second insulating interlayer formed thereover may be planarized. Because the second insulating interlayer is provided between the hillocks and the electroconductive layer, the copper interconnect and the electroconductive layer may be prevented from contacting with each other. By virtue of this configuration, short-circuiting between the electroconductive layer formed over the second insulating interlayer and the lower copper interconnect, and degradation in the margin for short-circuiting may be avoidable.

The electroconductive layer formed herein over the second insulating interlayer may be the lower electrode of a capacitor element, and the semiconductor device may be configured as containing the capacitor element having a capacitor film and an upper electrode stacked in this order over the lower electrode. By the configuration of the above structure, a semiconductor device having a capacitor element excellent in the yield ratio and reliability, and a method of manufacturing the same may be realized. Because the second insulating interlayer is provided between the hillocks and the lower electrode of the capacitor element, the copper interconnect and the lower electrode may be prevented from contacting with each other, and thereby electrical characteristics of these components may be maintained at a desirable level.

The present invention may, therefore, realize a semiconductor device well prevented from being short-circuited between the copper interconnect and the electroconductive layer formed thereon, and from being degraded in the margin for short-circuiting, and a method of fabricating the same.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
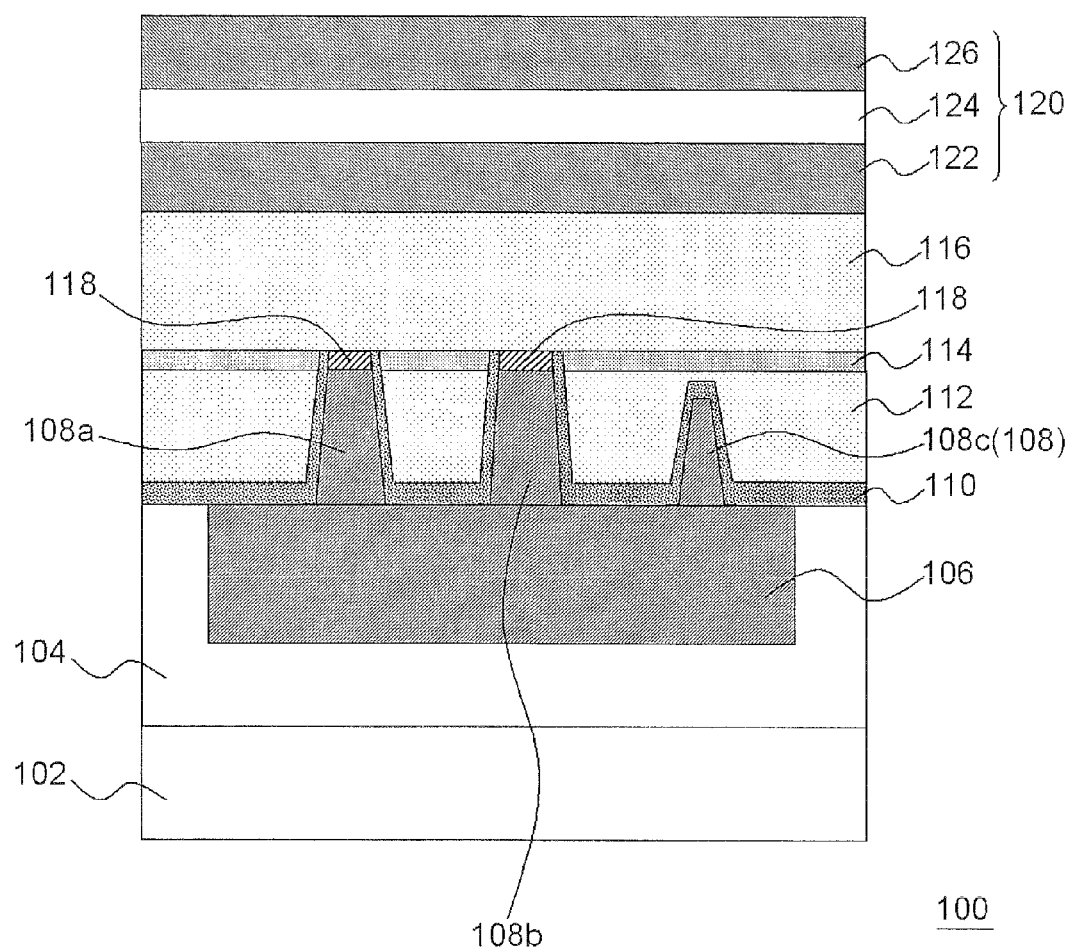
FIG. 1 is a sectional view showing an exemplary semiconductor device in an embodiment of the present invention.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Paragraphs below will detail a preferred embodiment of the semiconductor device and the method of fabricating the same according to the present invention, referring to the attached drawings. It is to be noted that in the explanation of the drawings, any identical constituents will be given with the same reference numerals, and explanations therefore will not be repeated.

FIG. 1 is a sectional view showing an exemplary configuration of a semiconductor device 100 of this embodiment.

The semiconductor device 100 contains a substrate 102, an insulating film 104 formed thereover, a lower copper interconnect 106 formed in the insulating film 104, a diffusion barrier film 110 formed on the insulating film 104, a first insulating interlayer 112 formed on the diffusion barrier film 110, a second insulating interlayer 116 formed on the first insulating interlayer 112, and a capacitor element 120 formed on the second insulating interlayer 116. The substrate 102 may be a semiconductor substrate such as a silicon substrate. Although not shown, the substrate 102 has elements such as transistors formed thereon. The insulating film 104 may be configured by a plurality of layers, and may be configured typically as having contact plugs formed therein. Any other insulating film may be placed between the substrate 102 and the insulating film 104.

In this embodiment, the lower copper interconnect 106 is composed of a material containing copper as a major component. The lower copper interconnect 106 may be configured as containing other metals such as Al, Pd, Ag or the like, in addition to copper. At the interface between the insulating film 104 and the lower copper interconnect 106, a barrier metal (not shown) blocking diffusion of copper is provided.

In this embodiment, the lower copper interconnect 106 has a first hillock 108a, a second hillock 108b and a third hillock 108c (height of the hillocks expressed as 108b>108a>108c) formed on the surface thereof. These hillocks will generally be referred to as hillocks 108 in the following description. The hillocks 108 are projections composed of copper (Cu), and are produced by collision of the grain boundaries exposed to the surface of the lower copper interconnect 106.

The diffusion barrier film 110 is formed so as to cover the side faces of the hillocks 108. The diffusion barrier film (cap film) 110 has a function of blocking diffusion of copper. Material composing the diffusion barrier film 110 may be SiCN film, silicon nitride ($SiN_x$) film or the like. The diffusion barrier film 110 composed of this sort of material may be allowed to function as an etching stopper film used when plug holes are formed in the first insulating interlayer 112 or the like. Thickness of the diffusion barrier film 110 may be adjusted to 50 nm to 150 nm, for example.

The top surfaces of at least one hillock highest of all hillocks 108, in this embodiment, the first hillock 108a and the second hillock 108b, are brought into contact with the lower surface of the second insulating interlayer 116. The top surfaces of the first hillock 108a and the second hillock 108b brought into contact with the lower surface of the second insulating interlayer 116 are alloyed, to thereby form an alloy film 118 (Si—Cu alloy film). Because the first hillock 108a and the second hillock 108b are surrounded by such alloy film 118 and the diffusion barrier film 110, copper composing the hillocks is prevented from diffusing into the peripheral insulating film. The third hillock 108c having the top surface not in contact with the lower surface of the second insulating interlayer 116 is covered over the entire portion of the side faces and top surface thereof with the diffusion barrier film 110. By virtue of this configuration, copper composing the third hillock 108c is prevented from diffusing into the peripheral insulating film.

The first insulating interlayer 112 may be of any species, so far as it may be planarized by CMP or the like. The first insulating interlayer 112 may be configured by, for example, a Si-containing film such as silicon oxide film ($SiO_2$), SiOC film, SiCN film, L-Ox film or the like. Thickness of the first insulating interlayer 112 may be 100 nm to 400 nm, for example. The first insulating interlayer 112 further contains a modified film 114 formed in the region in contact with the second insulating interlayer 116. The modified film 114 is a layer obtained by modifying a film composing the first insulating interlayer 112 typically by plasma irradiation. Provision of this sort of layer may improve adhesiveness between the first insulating interlayer 112 and the second insulating interlayer 116.

Also the second insulating interlayer 116 may be configured by a Si-containing film such as silicon oxide film ($SiO_2$), SiOC film, SiCN film, L-Ox film or the like. The second insulating interlayer 116 may be configured by a film of the same species with the first insulating interlayer 112, or may be configured by a film of different species. Thickness of the second insulating interlayer 116 may be 100 nm to 400 nm, for example.

The capacitor element 120 is a MIM-type capacitor element, and is configured by a lower electrode 122 provided on the second insulating interlayer 116, a capacitor film 124 formed on the lower electrode 122, and an upper electrode 126 formed on the capacitor film 124.

Material composing the lower electrode 122 may be metal such as titanium nitride (TiN), tantalum nitride (TaN) or tungsten nitride (WN). A material composing the upper electrode 126 may be the same with the lower electrode 122, or may be different. Material composing the capacitor film 124 may be, for example, silicon nitride, ZrO, TaO, ZrTaO or the like. The capacitor film 124 may be formed by CVD or reactive sputtering. Thickness of the lower electrode 122, the capacitor film 124 and the upper electrode 126 may be typically 150 nm to 300 nm, 10 nm to 20 nm, and 100 nm to 200 nm, respectively, for example.

Next, procedures for manufacturing the semiconductor device 100 of this embodiment will be explained, referring to FIGS. 2A to 5B.

First, over the substrate 102 having transistors, resistors and so forth formed therein, the insulating film 104 is formed by chemical vapor deposition (CVD). Next, the lower copper interconnect 106 is formed by the damascene process. First, an interconnect trench, in which the lower copper interconnect 106 is formed later, is formed by photolithography and dry etching in the insulating film 104.

Figure 2A:
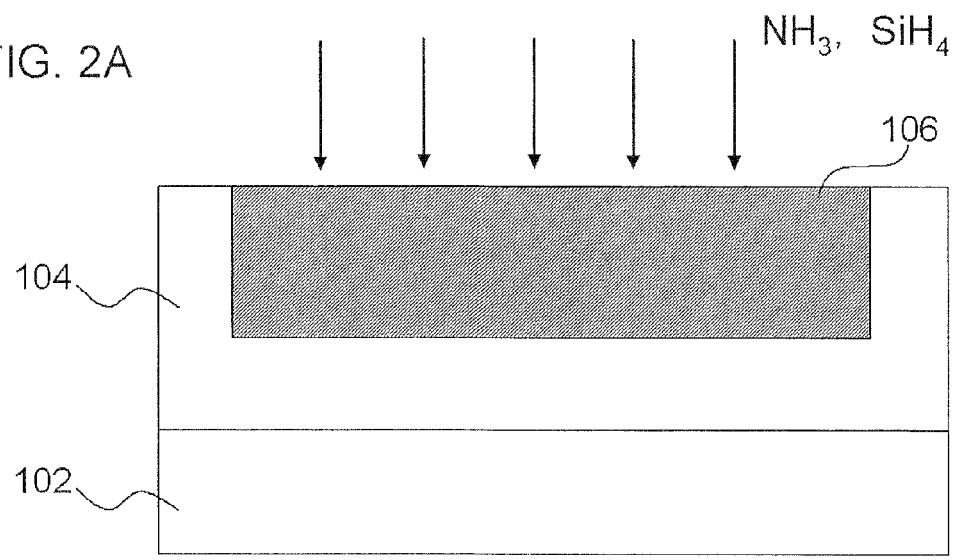
FIGS. 2A to 5B are sectional views sequentially showing procedures of manufacturing the semiconductor device in the embodiment of the present invention.

Next, a barrier metal composed of tantalum nitride (TaN) or the like (not shown) is formed over the entire surface to a thickness of 30 nm to 50 nm or around. Thereafter, a copper seed layer is formed to a thickness of 50 nm to 200 nm, and thereon a copper film is formed by electrolytic plating to a thickness of 500 nm to 1000 nm. Next, the substrate is annealed under an atmosphere of inert gas such as argon, nitrogen or the like, within the temperature range from 200° C. or higher and 500° C. or lower. By the annealing, grains in the copper film grow, and thereby the lower copper interconnect 106 may be reduced in resistivity. Next, the copper film is polished by CMP, until the top surface of the upper insulating film 104 exposes. By this process, the lower copper interconnect 106 is formed (FIG. 2A). Although the copper film annealed after being grown may produce hillocks on the surface thereof, such hillocks will be removed later in the CMP process.

Figure 2B:
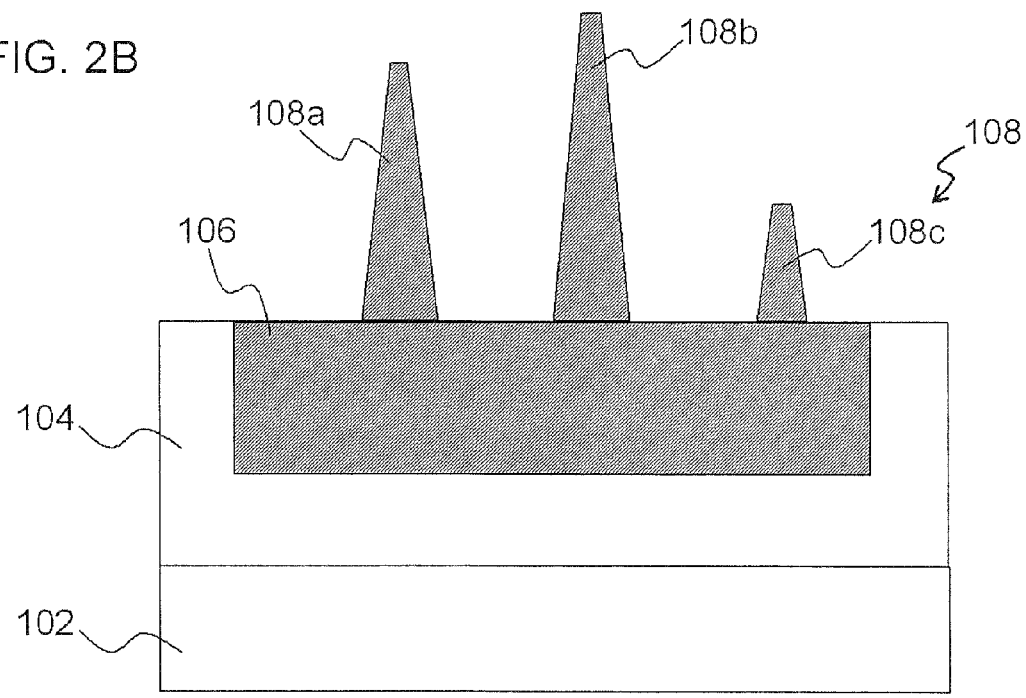

Thereafter, the diffusion barrier film 110 is formed on the insulating film 104, wherein before forming the diffusion barrier film 110, pretreatment is carried out in order to remove an oxide film on the surface of the lower copper interconnect 106, and to improve adhesiveness to the diffusion barrier film 110. The pretreatment involves annealing, so that the hillocks 108 such as the first hillock 108a to third hillock 108c are produced on the surface of the lower copper interconnect 106 (FIG. 2B). More specifically, as the pretreatment, the surface of the lower copper interconnect 106 is irradiated with plasma in a $NH_3$ gas or $SiH_4$ gas atmosphere, at an annealing condition of 350° C. or around. The hillocks 108 may grow up to a variety of sizes, wherein some of them grow to as high as 2 μm or around.

Figure 3A:
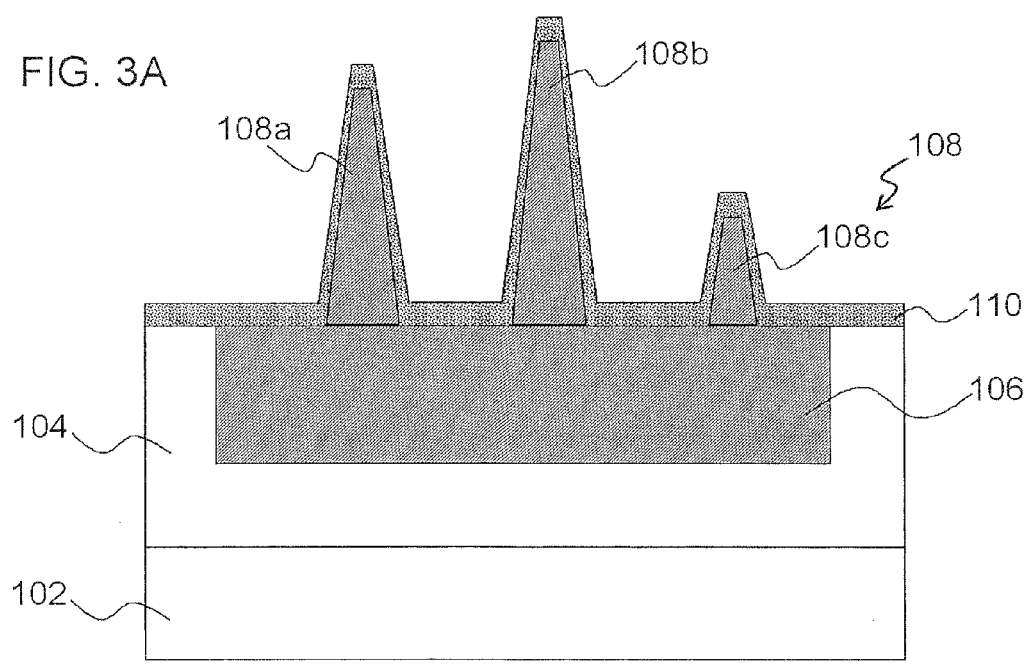

Next, the diffusion barrier film 110 is formed by CVD over the entire surface. In this process, the diffusion barrier film 110 is formed on the upper surface and the side faces of the first hillock 108a to third hillock 108c (FIG. 3A).

Figure 3B:
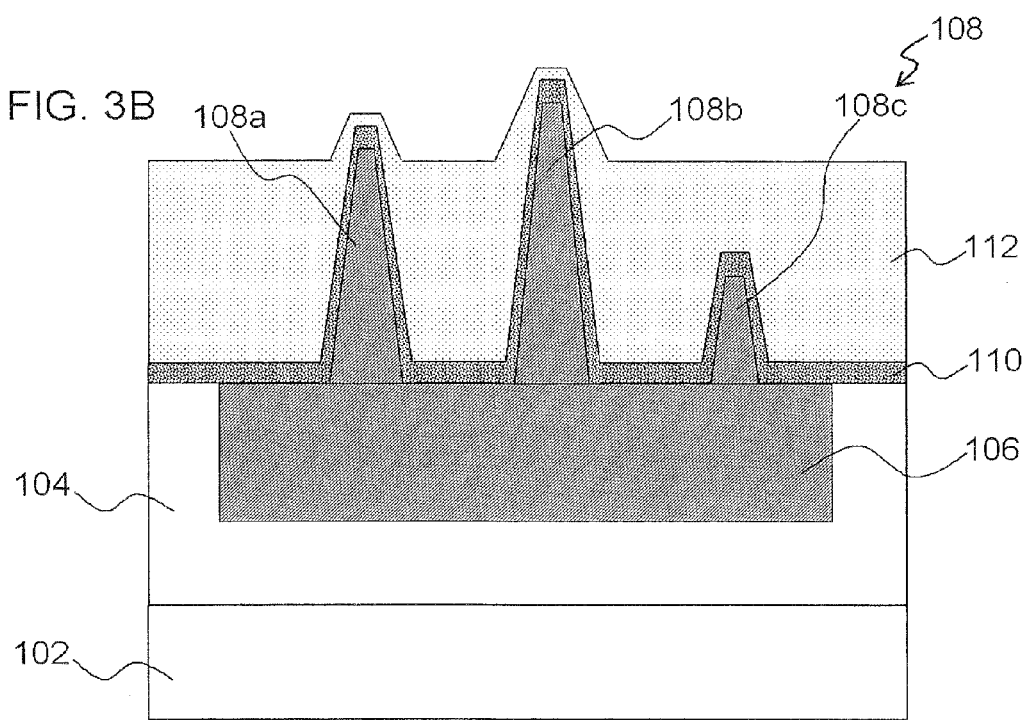

Next, the first insulating interlayer 112 is formed by CVD on the diffusion barrier film 110. Thickness of the first insulating interlayer 112 may be 200 nm, for example. As described in the above, if the hillocks 108 as high as 2 μm or around are produced, the difference in height cannot be absorbed even after the first insulating interlayer 112 is formed on the diffusion barrier film 110, and therefore the difference in height remain on the surface of the first insulating interlayer 112 (FIG. 3B). Accordingly, if the hillocks 108 are remained unremoved, the difference in height will undesirably be reflected into the capacitor element 120.

Figure 4A:
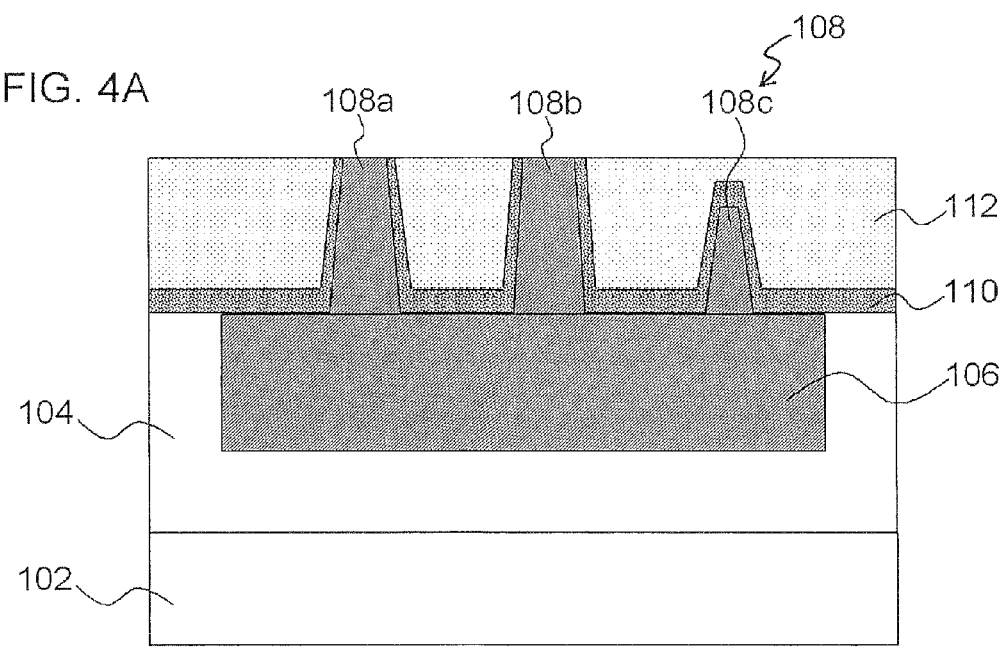

In order to solve the problem of the difference in height, the surface of the first insulating interlayer 112 in this embodiment is polished by CMP for planarization after it is formed. By this process, the thickness of the first insulating interlayer 112 is reduced, for example, to 100 nm or around. In this stage, the first hillock 108a and the second hillock 108b having larger height are exposed to the surface of the first insulating interlayer 112 (FIG. 4A). By planarizing the surface of the first insulating interlayer 112 in this way, any layer formed thereon later will be planarized.

However, if the capacitor element 120 should directly be formed on the first insulating interlayer 112, the hillocks 108 exposed to the surface of the first insulating interlayer 112 will be brought into contact with the lower electrode 122 of the capacitor element 120. If voltage is applied to the lower copper interconnect 106 or to the lower electrode 122 in this configuration, the both will be electrically connected. This may raise a problem of unintended electrical connection or increase in resistivity. In order to solve this problem, in this embodiment, the second insulating interlayer 116 is further formed on the first insulating interlayer 112. By virtue of this configuration, the hillocks 108 and the lower electrode 122 may be isolated, and thereby unintended electrical connection or the like may be avoidable.

Figure 4B:
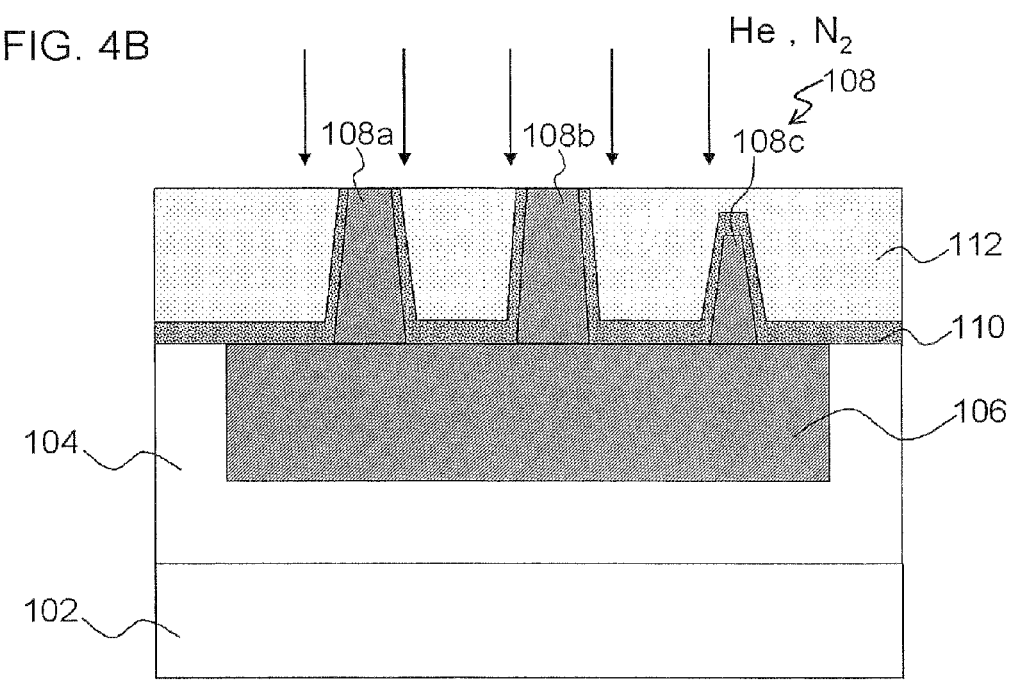
Figure 5A:
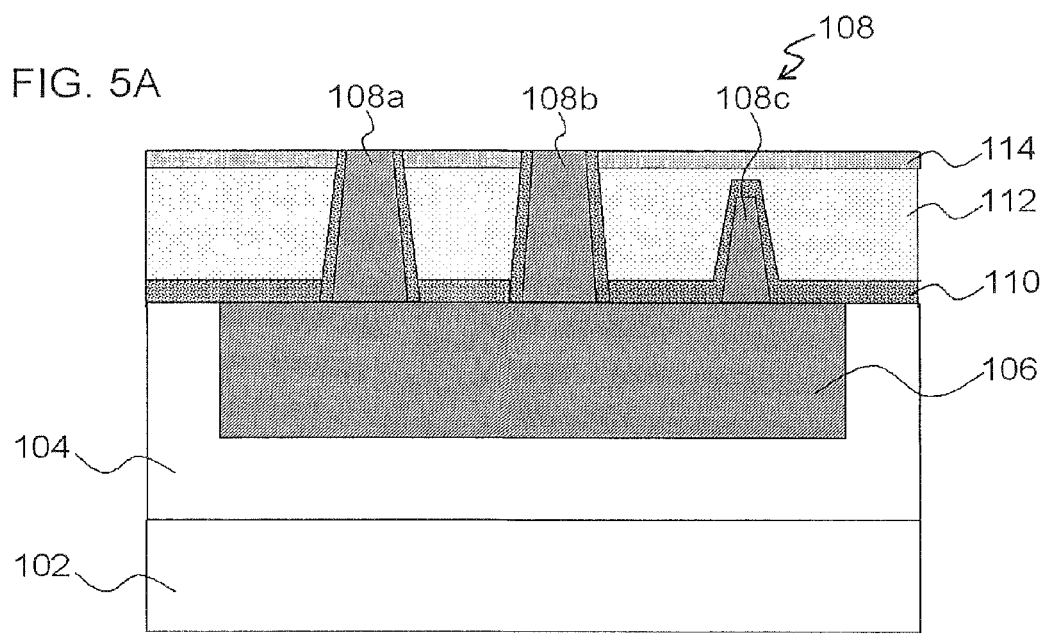

Before the second insulating interlayer 116 is formed on the first insulating interlayer 112, the surface of the first insulating interlayer 112 is modified, in order to improve adhesiveness between the first insulating interlayer 112 and the second insulating interlayer 116. More specifically, the entire surface of the first insulating interlayer 112 is irradiated by plasma in an atmosphere of He gas, $N_2$ gas or ammonia gas (FIG. 4B). By this treatment, the surface of the first insulating interlayer 112 is modified, and the modified film 114 is formed (FIG. 5A). The modified film 114 is composed of SiO, SiON or the like.

Figure 5B:
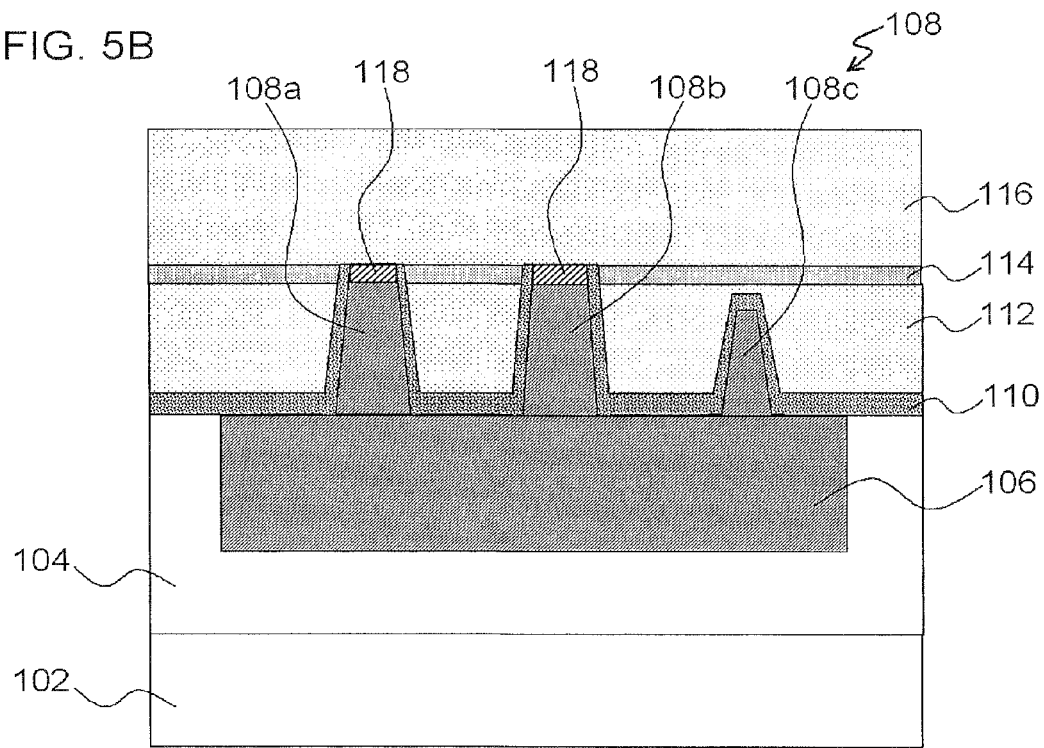

Thereafter, the second insulating interlayer 116 is formed by CVD on the first insulating interlayer 112. Thickness of the second insulating interlayer 116 may be adjusted, for example, to 100 nm or around. For the case where the second insulating interlayer 116 is configured by a Si-containing film, source gas for forming the film contains a Si-containing gas such as $SiH_4$. As a consequence, in the process of formation of the second insulating interlayer 116, the surficial Cu of the first hillock 108a and the second hillock 108b exposed to the surface of the first insulating interlayer 112 reacts with the Si-containing gas so as to alloy these portions, and thereby the alloy layer (Cu—Si alloy layer) 118 is formed (FIG. 5B). Because the second insulating interlayer 116 is formed on the planarized first insulating interlayer 112, also the surface of the second insulating interlayer 116 may be planarized.

Thereafter, the lower electrode 122, the capacitor film 124 and the upper electrode 126 are formed in this order on the second insulating interlayer 116. By this process, the semiconductor device 100 configured as shown in FIG. 1 may be formed.

Next, effects of this embodiment will be explained. In this embodiment, after the diffusion barrier film 110 and the first insulating interlayer 112 are formed on the lower copper interconnect 106, the surface of the first insulating interlayer 112 is planarized. As a matter of course, the second insulating interlayer 116 may be formed on the flat surface, and thereby also the surface of the second insulating interlayer 116 may be planarized. The capacitor element 120 may therefore be formed as being flat, even if the hillocks 108 are formed on the surface of the lower copper interconnect 106. Moreover, the second insulating interlayer 116 is further formed on the first insulating interlayer 112 after being planarized, so that short-circuiting between the hillocks 108 and the lower electrode 122 of the capacitor element 120 may also be prevented. Electrical characteristics of the lower copper interconnect 106 and the lower electrode 122 may therefore be kept at desirable levels, and thereby the semiconductor device 100 having the capacitor element 120 excellent in the yield ratio and reliability, and a method of manufacturing the same may be realized. In addition, diffusion of Cu from the Cu hillocks into the insulating interlayer (116) may be prevented by the Cu—Si layer (118) formed on the top surface of the hillocks.

The present invention has been explained referring to the embodiments. It may readily be understood by those skilled in the art, that the embodiments are mere examples, and various modifications are allowable as for combinations of the individual constituents and the individual treatment processes, and that also such modifications are within the scope of the present invention.

In the embodiments described in the above, area (size) of the lower electrode 122, the capacitor film 124, and the upper electrode 126 was not specifically limited, wherein the lower electrode 122 may be set larger than those of the capacitor film 124 and the upper electrode 126. This configuration allows formation of a contact to the lower electrode 122 from the top side of the semiconductor device 100, if a via plug is connected to the lower electrode 122 specifically in a portion thereof having no capacitor film 124 nor the upper electrode 126 formed thereon.

While the embodiments in the above have been explained referring to the case where the semiconductor device 100 contains the capacitor element 120, the present invention may be applicable to multi-layer structure. More specifically, the present invention is applicable also to the case where an upper interconnect, in place of the capacitor element 120 shown in FIG. 1, is formed on the lower copper interconnect 106. The upper interconnect herein may be a copper interconnect, or may be an interconnect composed of any other material. In general, the multi-layer structure contains local interconnect layer formed over a semiconductor substrate having MOS-FET (metal oxide semiconductor field effect transistor) formed thereon, semi-global interconnect layer formed thereon, and global interconnect layer formed still further thereon. The lower copper interconnect 106 shown in FIG. 1 and the interconnect (not shown) may be provided to any level of layers in the multi-layer structure, so far as a positional relation such that the upper interconnect is placed above the lower copper interconnect 106 is satisfied.

It is apparent that the present invention is not limited to the above embodiment, that may be modified and changed without departing from the scope and spirit of the invention.

What is claimed is:

1. A semiconductor device, comprising:
a substrate;
an insulating film formed over said substrate;
a copper interconnect, having a plurality of hillocks formed over the surface thereof, buried in said insulating film;
a first insulating interlayer formed over said insulating film and said copper interconnect with at least one of said plurality of hillocks extending through said first insulating interlayer;
a second insulating interlayer formed over said first insulating interlayer;
an electroconductive layer formed over said second insulating interlayer;
a diffusion barrier film formed over said insulating film and said copper interconnect, wherein said first insulating interlayer is formed over said insulating film and said copper interconnect, while placing said diffusion barrier film in between,
wherein the top surface of said at least one hillock is brought into contact with the lower surface of said second insulating interlayer, and said diffusion barrier film is formed along the sidewalls of said plurality of hillocks, and along the top surface of the hillocks other than said at least one hillock brought into contact with the lower surface of said second insulating interlayer.

2. The semiconductor device as claimed in claim 1, wherein said at least one hillock brought into contact with the lower surface of said second insulating interlayer contains a Cu—Si layer formed in the region brought into contact with said second insulating interlayer.

3. The semiconductor device as claimed in claim 1, wherein said first insulating interlayer contains a modified film formed in the region brought into contact with said second insulating interlayer.

4. The semiconductor device as claimed in claim 1, further comprising a capacitor element having a lower electrode as said electroconductive layer, a capacitor film, and an upper electrode stacked in this order, over said second insulating interlayer.

5. The semiconductor device as claimed in claim 1, wherein the top surface of said at least one hillock is planarized.

6. The semiconductor device as claimed in claim 1, wherein said at least one hillock includes a Cu—Si layer between the top surface of said at least one hillock and the lower surface of said second insulating interlayer.

7. The semiconductor device as claimed in claim 1, wherein said at least one hillock includes more than one of said plurality of hillocks.

8. A semiconductor device, comprising:
a substrate;
an insulating film formed over said substrate;
a copper interconnect, having a plurality of hillocks formed over the surface thereof, buried in said insulating film;
a first insulating interlayer formed over said insulating film and said copper interconnect with at least one of said plurality of hillocks extending through said first insulating interlayer;
a second insulating interlayer formed over said first insulating interlayer;
an electroconductive layer formed over said second insulating interlayer; and
a diffusion barrier film formed over said insulating film and said copper interconnect, said diffusion barrier film being formed along the sidewalls of said plurality of hillocks, and along the top surface of the hillocks other than said at least one hillock brought into contact with the lower surface of said second insulating interlayer, and said first insulating interlayer being formed over said insulating film and said copper interconnect, while placing said diffusion barrier film in between and a capacitor element having a lower electrode as said electroconductive layer, a capacitor film, and an upper electrode stacked in this order, over said second insulating interlayer,
wherein said at least one hillock brought into contact with the lower surface of said second insulating interlayer contains a Cu—Si layer formed in the region brought into contact with said second insulating interlayer, and said first insulating interlayer contains a modified film formed in the region brought into contact with said second insulating interlayer, and wherein the top surface of said at least one hillock is brought into contact with the lower surface of said second insulating interlayer.

9. A semiconductor device, comprising:

a substrate;

an insulating film formed over said substrate;

a copper interconnect buried in said insulating film, the copper interconnect having a surface with a plurality of hillocks formed thereover;

a plurality of insulating interlayers formed over said insulating film and said copper interconnect;

a diffusion barrier film formed between said copper interconnect and said plurality of insulating interlayers; and an electroconductive layer formed over said plurality of insulating interlayers, wherein at least one of said plurality of hillocks extends through a lowermost one of said plurality of insulating interlayers, and said diffusion barrier film is formed along sidewalls of said plurality of hillocks, and along top surfaces of the hillocks other than said at least one hillock.

10. The semiconductor device as claimed in claim 9, wherein a top surface of said at least one hillock contacts a lower surface of an uppermost one of said plurality of insulating interlayers.

11. The semiconductor device as claimed in claim 10, wherein said top surface of said at least one hillock includes a Cu—Si layer formed contacting the lower surface of the uppermost one of said plurality of insulating interlayers.

12. The semiconductor device as claimed in claim 9, wherein said plurality of insulating interlayers includes a modified film formed between the lowermost and uppermost ones of said plurality of insulating interlayers.

13. The semiconductor device as claimed in claim 9, further comprising a capacitor element having a lower electrode as said electroconductive layer, a capacitor film, and an upper electrode stacked in this order, over said plurality of insulating interlayers.

* * * * *